US010491215B2

(12) United States Patent
Cho et al.

(10) Patent No.: US 10,491,215 B2
(45) Date of Patent: *Nov. 26, 2019

(54) CALIBRATION CIRCUIT AND CALIBRATION APPARATUS INCLUDING THE SAME

(71) Applicant: SK hynix Inc., Icheon-si, Gyeonggi-do (KR)

(72) Inventors: Oung Sic Cho, Icheon-si (KR); Jong Hoon Oh, Seongnam-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/101,998

(22) Filed: Aug. 13, 2018

(65) Prior Publication Data

US 2018/0351555 A1 Dec. 6, 2018

Related U.S. Application Data

(63) Continuation of application No. 15/626,648, filed on Jun. 19, 2017, now Pat. No. 10,075,165, which is a continuation of application No. 14/661,687, filed on Mar. 18, 2015, now Pat. No. 9,716,497.

(30) Foreign Application Priority Data

Oct. 28, 2014 (KR) .................. 10-2014-0147541

(51) Int. Cl.
    *H03K 19/00* (2006.01)
(52) U.S. Cl.
    CPC ................ *H03K 19/0005* (2013.01)
(58) Field of Classification Search
    CPC .................................... H03K 19/0005

USPC ............................................. 326/30
See application file for complete search history.

(56) References Cited

U.S. PATENT DOCUMENTS

| 7,696,778 | B1 | 4/2010 | Sreeramaneni et al. |
| 2005/0226080 | A1* | 10/2005 | Lee ................... G11C 5/04 365/230.03 |
| 2008/0074138 | A1 | 3/2008 | Lee |
| 2008/0109595 | A1 | 5/2008 | Rajan et al. |
| 2011/0066798 | A1 | 3/2011 | Kaiwa et al. |
| 2011/0102073 | A1 | 5/2011 | Riho |
| 2011/0193590 | A1 | 8/2011 | Nakagawa et al. |
| 2011/0242916 | A1 | 10/2011 | Seol et al. |

(Continued)

FOREIGN PATENT DOCUMENTS

KR      1020110013704 A    2/2011

*Primary Examiner* — Don P Le
(74) *Attorney, Agent, or Firm* — William Park & Associates Ltd.

(57) ABSTRACT

A calibration circuit sharing a resistor for impedance matching includes a command decoder configured to receive a command signal and decode the command signal into a calibration enable signal; a selector configured to select one of the calibration enable signal and a start signal according to a select signal, and provide a driving signal; and a calibration driver configured to perform an impedance matching operation in response to the driving signal, and generate a completion signal when performance is completed, wherein the start signal corresponds to a completion signal provided from another calibration circuit which shares the resistor for the impedance matching.

20 Claims, 7 Drawing Sheets

(56) References Cited

U.S. PATENT DOCUMENTS

| | | |
|---|---|---|
| 2013/0015880 A1 | 1/2013 | Haraguchi |
| 2015/0117122 A1 | 4/2015 | Lee et al. |
| 2016/0204782 A1 | 7/2016 | Lee et al. |
| 2017/0040049 A1 | 2/2017 | Arai et al. |
| 2017/0109091 A1* | 4/2017 | Gans .................... G06F 3/0604 |
| 2017/0351451 A1 | 12/2017 | Gans |

* cited by examiner

CALIBRATION CIRCUIT AND CALIBRATION APPARATUS INCLUDING THE SAME

CROSS-REFERENCES TO RELATED APPLICATION

The present application claims priority under 35 U.S.C. § 119(a) to Korean application number 10-2014-0147541, filed on Oct. 28, 2014, in the Korean Intellectual Property Office, which is incorporated herein by reference in its entirety.

BACKGROUND

1. Technical Field

Various embodiments generally relate to a calibration circuit and a calibration apparatus including the same, and more particularly, to a calibration circuit for matching impedances and a calibration apparatus in which a plurality of calibration circuits sharing a resistor for impedance matching sequentially perform impedance calibrating operations.

2. Related Art

Electronic devices may include a buffer or a driving circuit for input and output of data or signals from and to an exterior. Terminals for performing input and output are electrically coupled with transmission lines. Because an impedance difference occurs between an interior and an exterior, it is necessary to match the impedances of input and output terminals and the impedances of transmission lines.

An impedance mismatch may occur due to noise, a variation in a power supply voltage, a variation in an operating temperature, a variation in a manufacturing process, and so forth. If impedance matching is not accomplished, operational reliability may deteriorate since it is difficult to sense the precise values of input and output data or signals.

SUMMARY

In an embodiment, a calibration circuit sharing a resistor for impedance matching may include a command decoder configured to receive a command signal and decode the command signal into a calibration enable signal. The calibration circuit may also include a selector configured to select one of the calibration enable signal and a start signal according to a select signal, and provide a driving signal. The calibration circuit may also include a calibration driver configured to perform an impedance matching operation in response to the driving signal, and generate a completion signal when performance is completed. Further, the start signal corresponds to a completion signal provided from another calibration circuit which shares the resistor for the impedance matching.

In an embodiment, a calibration apparatus may include a first calibration circuit configured to perform an impedance matching operation according to a resistor for impedance matching, in response to a first calibration enable signal generated by decoding a command signal, and generate a completion signal as performance is completed. In addition, the calibration apparatus may include a second calibration circuit configured to share the resistor for the impedance matching with the first calibration circuit, and perform an impedance matching operation according to the completion signal.

In an embodiment, a calibration circuit includes a selector configured to select a calibration enable signal or a start signal in response to a select signal to provide a driving signal. The calibration circuit also includes a calibration driver configured to perform an impedance matching operation according to the driving signal and generate a completion signal. Further, the calibration driver performs the impedance matching operation by comparing a value received from a resistor for impedance matching to a reference value for generating a matching code.

DETAILED DESCRIPTION

Hereinafter, a calibration circuit and a calibration apparatus including the same will be described below with reference to the accompanying figures through various embodiments. Various embodiments are directed to a calibration circuit which may start an impedance matching operation in response to an external command signal and a signal generated as impedance matching is completed in another internal circuit. In addition, various embodiments are directed to a calibration circuit which may generate a completion signal as an impedance matching operation is completed such that another calibration circuit sharing a resistor for impedance matching may start an impedance matching operation. Further, various embodiments are directed to a calibration apparatus which include a plurality of the calibration circuits to receive completion signals from immediately previous calibration circuits, as start signals, and sequentially perform impedance matching operations, thereby reducing a total impedance matching time. According to the embodiments, the calibration circuit and the calibration apparatus including the same according to the embodiments may selectively perform an impedance calibration (ZQ) in one die among a plurality of dies in response to one signal of a command signal applied from an exterior and a signal applied from another calibration circuit to indicate completion of impedance matching. Therefore, in comparison with the case in which impedance matching is performed by applying respective commands when a plurality of calibration circuits operate, a total calibration time may be decreased.

Figure 1:
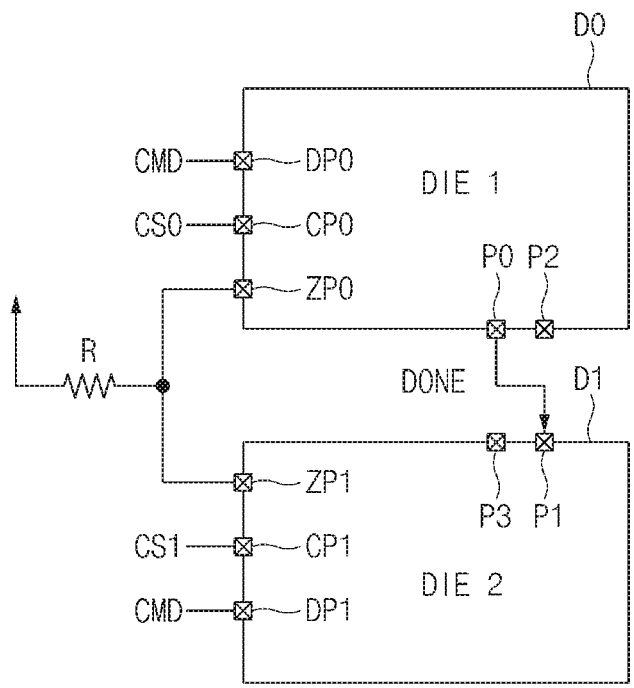
FIG. 1 is a diagram illustrating a representation of an example of a configuration including calibration circuits which share a resistor for impedance matching, in accordance with an embodiment.

Referring to FIG. 1, a diagram illustrating a representation of an example of a configuration including calibration circuits which share a resistor for impedance matching, in accordance with an embodiment is shown.

FIG. 1 shows the relationship of a first die D0 and a second die D1 which share a resistor R for impedance matching. The first die D0 and the second die D1 may include a calibration circuit disposed thereon. According to an embodiment, the first die D0 and the second die D1 may include a volatile memory or a nonvolatile memory. According to an embodiment, the first die D0 and the second die D1 may be formed with a volatile memory. According to another embodiment, the first die D0 and the second die D1 may be formed with a nonvolatile memory. According to the other embodiment, the first die D0 may be formed with a volatile memory and the second die D1 may be formed with a nonvolatile memory.

Further, the first die D0 and the second die D1 may include a driving circuit which performs operations for input and output of data or signals from and to an exterior based on the matching code generated in the calibration circuit. In this specification, the term calibration is used as a concept that includes impedance matching.

The first die D0 and the second die D1 simultaneously receive a command signal CMD through a first command pad DP0 and a second command pad DP1. Various control informations may be included in the command signal CMD. In this specification, it will be described as an example that a command for performing an impedance matching operation is included in the command signal CMD.

If the first die D0 and the second die D1 simultaneously perform impedance matching operations, since the plurality of dies D0 and D1 share the one resistor R for impedance matching, resistance values are likely to be distorted as a result. Therefore, at one time, one die is electrically coupled with the resistor R for impedance matching. Further, the one die performs an impedance matching operation.

A die selected by each of chip select signals CS0 and CS1 may perform an impedance matching operation. For example, the first die D0 may perform the impedance matching operation according to the value received through a first matching pad ZP0 from the resistor R for impedance matching according to the first chip select signal CS0 received through a pad CP0. Further, at a time different from a time when the first die D0 performs impedance matching, the second die D1 may perform the impedance matching operation according to the value received through a second matching pad ZP1 from the resistor R for impedance matching according to the second chip select signal CS1 received through a pad CP1.

However, because a certain time is required between times at which the chip select signals CS0 and CS1 are respectively provided, an unnecessary time may be consumed between times at which impedance matching is completely performed in the respective dies D0 and D1 as a result.

Hence, in the calibration circuit in accordance with an embodiment, the second die D1 may start impedance matching in response to a completion signal DONE generated as impedance matching is completed in the first die D0.

The respective dies D0 and D1 may include pads which provide the completion signal DONE to other dies and receive the completion signal DONE provided from other dies. For instance, the completion signal DONE may be outputted through a first pad P0 of the first die D0 and be provided to the second die D1 through a second pad P1. In addition, the second die D1 may provide the completion signal DONE to another die through a fourth pad P3 when impedance matching is completed. The first die D0 may receive the completion signal DONE from another side through a third pad P2.

According to the embodiment, the first die D0 and the second die D1 are connected by a chain structure. The completion signal DONE outputted from the fourth pad P3 of the second die D1 may be received by the third pad P2 of the first die D0.

Figure 2:
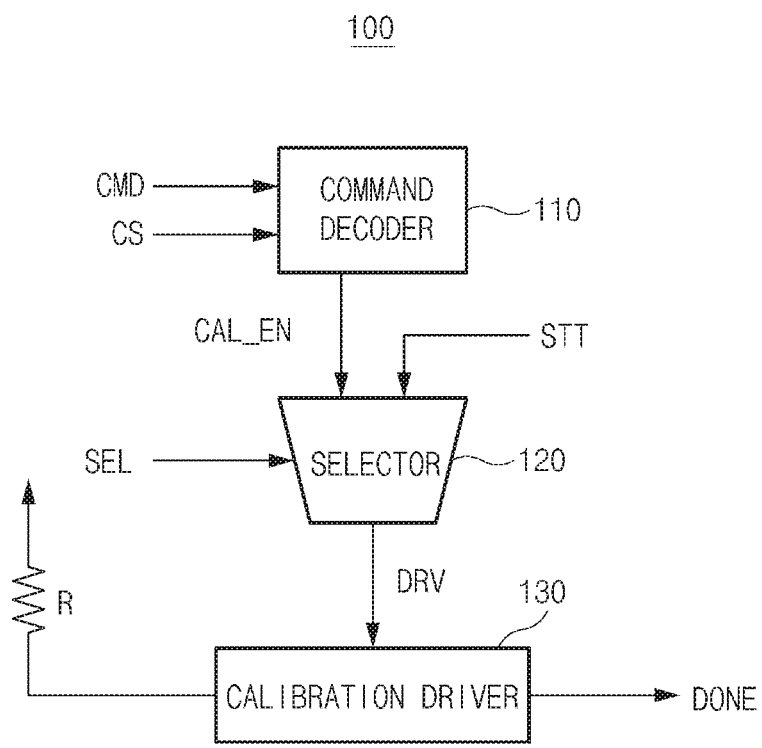
FIG. 2 is a block diagram illustrating a representation of an example of a calibration circuit in accordance with an embodiment.

Referring to FIG. 2, a block diagram illustrating a representation of an example of a calibration circuit in accordance with an embodiment is shown.

In FIG. 2, a calibration circuit 100 may include a command decoder 110, a selector 120, and a calibration driver 130.

The command decoder 110 decodes a command signal CMD received into a calibration enable signal CAL_EN. According to an embodiment, the command decoder 110 may decode the command signal CMD in response to a chip select signal CS. The command decoder 110 may selectively provide the calibration enable signal CAL_EN to the selector 120 based on the chip select signal CS.

In particular, the command signal CMD may be decoded where a corresponding chip is selected according to the chip select signal CS, or, where a plurality of calibration circuits are successively electrically coupled. Further, a calibration circuit which initially performs impedance matching may decode the command signal CMD. This is because it is not necessary to decode the command signal CMD where a calibration circuit 100 performs impedance matching in response to a completion signal DONE provided from another calibration circuit 100.

The selector 120 selects one of the calibration enable signal CAL_EN and a start signal STT in response to a select signal SEL, and provides a driving signal DRV. The start signal STT may correspond to the completion signal DONE provided from another calibration circuit 100 which shares a resistor R for impedance matching with the calibration circuit 100.

The select signal SEL provided to the selector 120 may correspond to a signal provided from an exterior of the calibration circuit 100, or may be a signal generated internally of the calibration circuit 100. A manner in which the select signal SEL is provided will be described in detail with reference to FIGS. 3 and 4 below.

The select signal SEL may be differently generated according to in which order a corresponding calibration circuit 100 is placed among sequential impedance matching operations. For example, when a calibration circuit 100 initially performs impedance matching in response to the command signal CMD, the command signal CMD should be selected and provided as the driving signal DRV. In this case, the start signal SU may not be provided from the exterior.

When a calibration circuit 100 receives the completion signal DONE from another calibration circuit 100 as the start signal SU, that is, a calibration circuit 100 which is not placed initially among the sequential impedance matching operations, the start signal SU should be selected and provided as the driving signal DRV.

According to the embodiment, if the calibration circuit 100 is the second die D1, an impedance calibration operation of the second die D1 may be automatically performed. That is, if the start signal SU is activated, the driving signal DRV is activated, and accordingly, an impedance calibration operation of the calibration circuit 100 may be performed by the calibration driver 130, regardless of a selection signal SEL.

According to an embodiment, the select signal SEL may be provided to the calibration driver 130 and control the generation of the completion signal DONE. For instance, when a calibration circuit 100 is placed finally among the sequential impedance matching operations, it is not necessary to provide the completion signal DONE to another calibration circuit 100. Accordingly, the select signal SEL includes an information on in which order a corresponding calibration circuit 100 is placed among the sequential impedance matching operations, such that the calibration driver 130 may not generate the completion signal DONE where the calibration circuit 100 corresponds to a calibration circuit which performs a final impedance matching operation. According to the embodiment, the completion signal DONE outputted from the second die D1 may be feedback inputted in the first die D0. In this case, a calibration circuit 100 generates the completion signal DONE and outputs the generated completion signal DONE to the first die D0.

The calibration driver 130 performs an impedance matching operation in response to the driving signal DRV. Further, the calibration driver 130 generates the completion signal DONE as the performance of impedance matching is completed. The calibration driver 130 performs the impedance matching operation by comparing the value received through the resistor R for impedance matching and a reference value and generating a matching code.

Since operations in the calibration driver 130 are similar to the conventional impedance matching operation, detailed descriptions thereof will be omitted.

The calibration driver 130 may generate the completion signal DONE by various methods. Methods for the calibration driver 130 to generate the completion signal DONE will be described later with reference to FIGS. 5 and 6 below.

As described above, the calibration circuit 100 in accordance with an embodiment receives the calibration enable signal CAL_EN generated based on the external command signal CMD and the start signal STT as the completion signal DONE is provided as impedance matching is completed in another calibration circuit, selects one of the two signals, and provides the driving signal DRV. Accordingly, impedance matching may be started according to the external command signal CMD or in response to a signal generated as impedance matching in an immediately previous calibration circuit where the sequential impedance matching operations are completed.

Therefore, it is possible to reduce times to be consumed between impedance matching operations of a plurality of dies in each of which the calibration circuit 100 is included. As a result, impedance matching may be performed in an immediately next calibration circuit when the operation of an immediately previous calibration circuit is completed.

Figure 3:
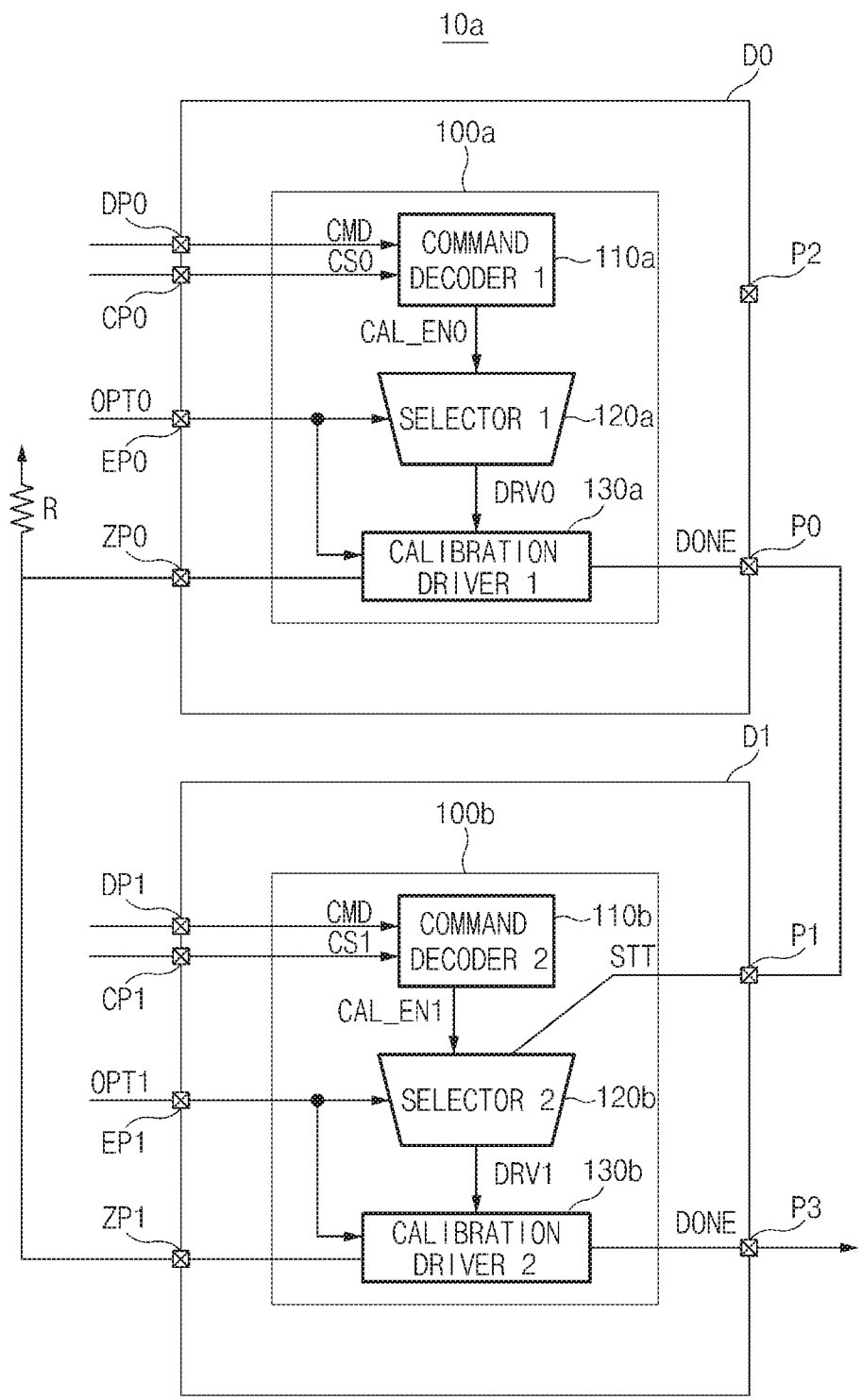
FIGS. 3 and 4 are diagrams illustrating representations of examples of calibration apparatuses including calibration circuits in accordance with embodiments.
Figure 4:
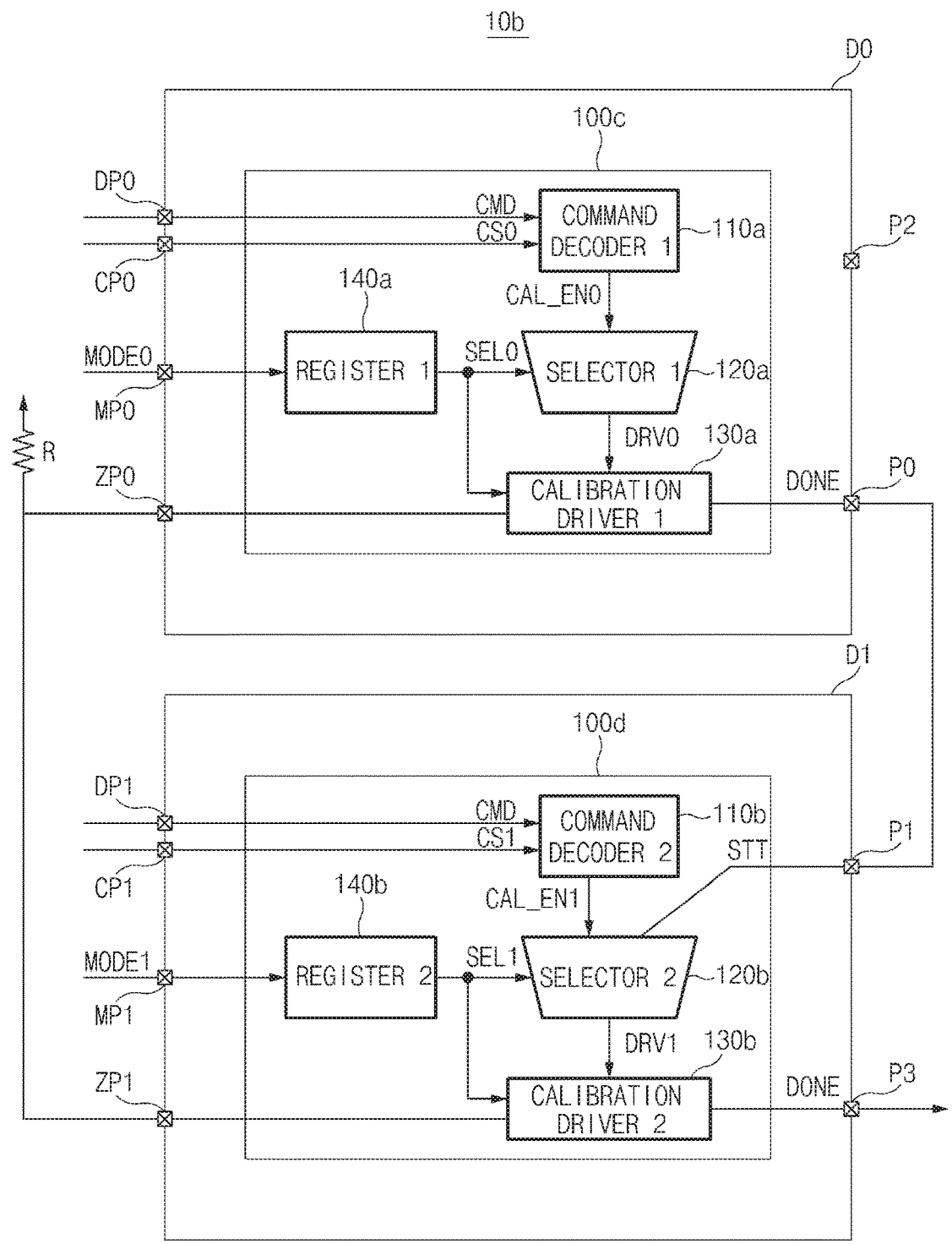

Referring to FIGS. 3 and 4, diagrams illustrating representations of examples of calibration apparatuses including calibration circuits in accordance with embodiments are illustrated. While it is shown in FIGS. 3 and 4 that two dies D0 and D1 are included in a calibration apparatus, it is to be noted that the embodiments are not limited to such an example and one or more dies may be additionally disposed between the first die D0 and the second die D1. According to the embodiment, as for a plurality of dies in calibration apparatuses, 4, 8, 16, 32, and more dies may be disposed, including the first die D0 and the second die D1. The dies formed with a plurality of calibration circuits may be mounted to one printed circuit board (PCB). The plurality of dies may sequentially perform impedance matching operations.

In FIG. 3, a calibration apparatus 10a may include a first calibration circuit 100a and a second calibration circuit 100b. The first calibration circuit 100a is formed on a first die D0. In addition, the second calibration circuit 100b is formed on a second die D1. The calibration apparatus is formed on one substrate.

The first calibration circuit 100a decodes a command signal CMD received through a first command pad DP0 into a first calibration enable signal CAL_EN0. The first calibration circuit 100a performs an impedance matching operation by reading in the value of a resistor R for impedance matching in response to the decoded first calibration enable signal CAL_EN0. In addition, the first calibration circuit 100a generates a completion signal DONE as the impedance matching operation is completed.

The completion signal DONE is provided to a second pad P1 of the second die D1 through a first pad P0 of the first die D0.

The second calibration circuit 100b formed in the second die D1 shares the resistor R for impedance matching, with the first calibration circuit 100a, and receives the completion signal DONE provided to the second pad P1, as a start signal SU. The second calibration circuit 100b performs an impedance matching operation according to the start signal STT.

Since the second calibration circuit 100b performs the impedance matching operation immediately in response to the completion of the impedance matching operation of the first calibration circuit 100a, time consumption does not occur between the impedance matching operations of the two calibration circuits 100a and 100b.

Both the first calibration circuit 100a and the second calibration circuit 100b have substantially the same configuration as the calibration circuit 100 described above with reference to FIG. 2.

The first calibration circuit 100a may include a first command decoder 110a which decodes the command signal CMD provided through the first command pad DP0. The first calibration circuit 100a may also include a first selector 120a which selects one of the first calibration enable signal CAL_EN0 decoded in the first command decoder 110a and a start signal (not shown) and provides a first driving signal DRV0. Further, the first calibration circuit 100a may include a first calibration driver 130a which starts the impedance matching operation in response to the first driving signal DRV0 and generates the completion signal DONE as impedance matching is completed.

While the first calibration circuit 100a may receive the start signal through a third pad P2 when viewed in its structure, because the first calibration circuit 100a is placed initially among sequential impedance matching operations, an immediately previous calibration circuit for providing the start signal to the first calibration circuit 100a does not exist. Accordingly, it is illustrated that the first calibration circuit 100a does not receive the start signal.

However, the embodiments of the present invention are not limited to such. The first calibration circuit 100a receives the start signal SU, which is applied from the second calibration circuit 100b, as the completion signal DONE through the third pad P2.

Moreover, according to an embodiment, the command decoder 110a may determine whether to decode the command signal CMD into the first calibration enable signal CAL_EN0 according to a first chip select signal CS0 provided through a pad CP0.

FIG. 3 shows that select signals (see the select signal SEL of FIG. 2) provided to the first calibration circuit 100a and the second calibration circuit 100b correspond to the voltage values provided through select pads EP0 and EP1. Moreover, a voltage corresponding to a select signal SEL for indicating an order of the second calibration circuit 100b among a plurality of circuits which share the resistor R for impedance matching that is received through a select pad EP1.

For example, if a voltage value corresponding to a power supply voltage VDD is provided to the first selector 120a through the first select pad EP0 as the select signal, the first selector 120a determines that the first calibration circuit 100a should start the impedance matching operation in response to not the start signal STT but the first calibration enable signal CAL_EN0.

The power supply voltage VDD may be provided as a first option signal OPT0 from an exterior. It is to be noted that the application of the power supply voltage VDD as described above is an illustration purpose. In addition, it is sufficient that the voltage values provided through the select pads EP0 and EP1 are values that may perform control tasks such that voltages capable of allowing the differences between the first calibration circuit 100a and the second calibration circuit 100b to be recognized are applied. Further, the respective calibration circuits 100a and 100b may be aware of their placements and select appropriate signals.

The fact that the first calibration circuit 100a starts the impedance matching operation in response to the first calibration enable signal CAL_EN0 may mean that the first calibration circuit 100a is a calibration circuit which initially performs the impedance matching operation, or, a calibration circuit which is placed initially.

The first calibration driver 130a performs the impedance matching operation according to the first driving signal DRV0. The first calibration driver 130a may perform the impedance matching operation by reading in the value of the resistor R for impedance matching through a first matching pad ZP0.

According to an embodiment, the generation of the completion signal DONE may be enabled or disabled according to the value provided through the first select pad EP0. For instance, since the first calibration circuit 100a is a calibration circuit which performs initially the impedance matching in sequential impedance matching operations, the first calibration circuit 100a should provide the completion signal DONE to another calibration circuit electrically coupled thereto, or, the second calibration circuit 100b. Accordingly, the first calibration driver 130a enables the generation of the completion signal DONE.

The second calibration circuit 100b may include a second command decoder 110b, a second selector 120b, and a second calibration driver 130b. The second command decoder 110b may receive a second chip select signal CS1 through a second chip select pad CP1. Further, the second command decoder 110b may selectively decode the command signal CMD provided through a second command pad DP1 into a second calibration enable signal CAL_EN1.

The second selector 120b receives the second calibration enable signal CAL_EN1 and the completion signal DONE provided as the start signal STT through the second pad P1. The second selector 120b selects the start signal STT based on a second option signal OPT1 received through the second select pad EP1. In addition, the second selector 120b provides a second driving signal DRV1 to the second calibration driver 130b. Accordingly, in the second calibration driver 130b, the impedance calibration operation is performed by a second driving signal DRV1 which is generated based on the completion signal DONE of the first calibration circuit 100a.

For example, if the first option signal OPT0 provided through the first select pad EP0 is a value corresponding to the power supply voltage VDD, the second option signal OPT1 provided through the second select pad EP1 may be a value corresponding to a ground voltage VSS. However, as described above, the first option signal OPT0 and the second option signal OPT1 are not limited to the voltage values described above. Further, it is to be noted that values capable of allowing the first calibration circuit 100a and the second calibration circuit 100b to be distinguished from each other are sufficient.

The option signals OPT0 and OPT1 may correspond to select signals (see the reference symbol SEL of FIG. 2) indicating that the corresponding calibration circuits 100a and 100b are placed in which orders when a plurality of calibration circuits are sequentially electrically coupled and perform impedance matching operations.

The second calibration driver 130b performs the impedance matching operation by reading the value of the resistor R for impedance matching according to the driving signal DRV through a second matching pad ZP1, comparing the value with a reference value, and generating a matching code. The second calibration driver 130b may generate or may not generate the completion signal DONE in response to the second option signal OPT1 provided through the second select pad EP1.

For example, if it is determined through the second option signal OPT1 that there is no calibration circuit to perform impedance matching, after the second calibration circuit 100b, the second calibration driver 130b may not generate the completion signal DONE. FIG. 3 illustrates that the second calibration driver 130b provides the completion signal DONE through a fourth pad P3. According to the embodiment, the completion signal DONE, generated in the second calibration circuit 100b, is inputted in the second calibration driver 130b by feedback. Then, the second calibration driver 130b receives the completion signal DONE through the third pad P2.

Referring to FIG. 4, a diagram illustrating a representation of an example of a calibration apparatus including calibration circuits in accordance with an embodiment is shown.

In FIG. 4, a calibration apparatus 10b may include a third calibration circuit 100c and a fourth calibration circuit 100d.

When compared to FIG. 3, the calibration circuits 100c and 100d of FIG. 4 may include registers 140a and 140b.

The calibration circuits 100a and 100b of FIG. 3 determine orders in which the corresponding calibration circuits 100a and 100b are placed by receiving the option signals OPT0 and OPT1 through the select pads EP0 and EP1. The calibration circuits 100c and 100d of FIG. 4 respectively include the registers 140a and 140b which receive mode signals MODE0 and MODE1 through mode pads MP0 and MP1 and temporarily store the mode signals MODE0 and MODE1. FIG. 4 also illustrates select signals SEL0 and SEL1.

In the plurality of calibration circuits 100c and 100d which share a resistor R for impedance matching, the mode signals MODE0 and MODE1 may correspond to signals indicating orders in which the corresponding calibration circuits 100a and 100b perform impedance matching among sequential impedance matching operations accordingly.

The mode signals MODE0 and MODE1 may be provided from a component element such as an external controller. Further, the mode signals MODE0 and MODE1 may be temporarily stored in the registers 140a and 140b. According to an embodiment, each of the mode signals MODE0 and MODE1 may correspond to a general mode register signal.

In addition, an information indicating a corresponding order may be included in one bit among a plurality of bits which configure the mode register signal. The registers 140a and 140b may be configured to receive the mode signals MODE0 and MODE1 that may indicate an order of a corresponding calibration circuit among calibration circuits which share the resistor R for impedance matching, and provide the select signal SEL0 or SEL1.

Figure 5:
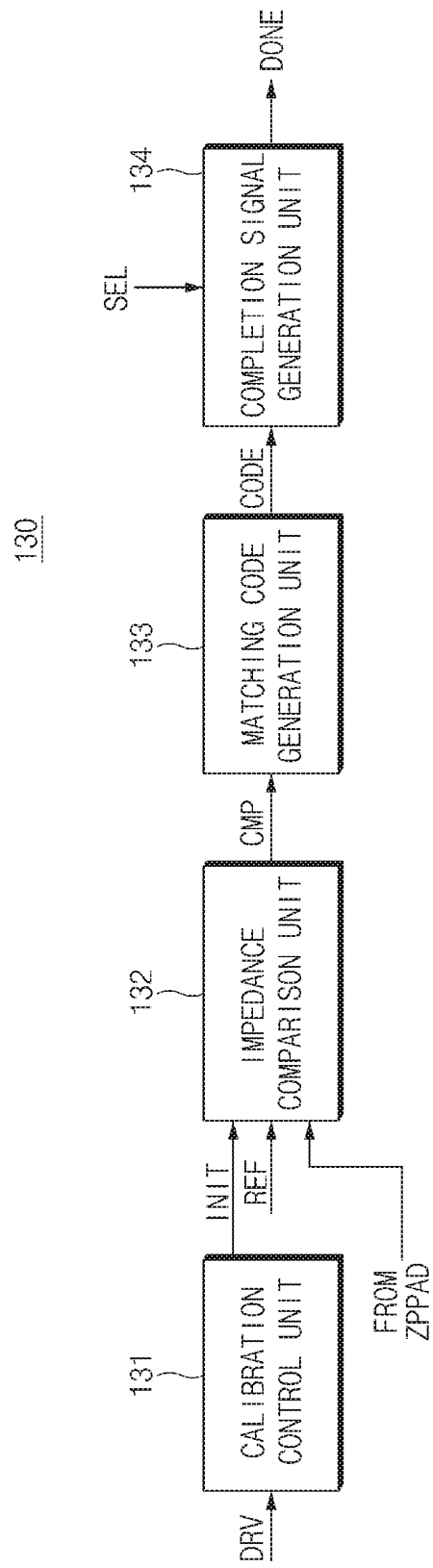
FIG. 5 is a block diagram illustrating a representation of an example of the calibration driver included in the calibration circuit in accordance with an embodiment.

Referring to FIG. 5, a block diagram illustrating a representation of an example of the calibration driver included in the calibration circuit in accordance with an embodiment is shown.

In FIG. 5, the calibration driver 130 may include a calibration control unit 131, an impedance comparison unit 132, a matching code generation unit 133, and a completion signal generation unit 134.

The calibration control unit 131 generates an operation start signal INIT in response to the driving signal DRV which is provided from the selector 120. The impedance comparison unit 132 receives the value of the resistor R for impedance matching, provided from the matching pad ZP (FROM ZPPAD), in response to the operation start signal INIT, and compares the value with a reference value REF. The impedance comparison unit 132 provides a comparison signal CMP corresponding to a comparison value to the matching code generation unit 133.

The matching code generation unit 133 generates a matching code CODE based on the comparison signal CMP. By controlling the value of a resistor electrically coupled to an output driver according to the matching code CODE, impedances may be matched accordingly.

The completion signal generation unit 134 generates the completion signal DONE as impedance matching is completed. The completion signal generation unit 134 may be configured to generate the completion signal DONE when a preset time has passed after the impedance matching operation has started in response to the driving signal DRV. According to an embodiment, the completion signal DONE may be generated in the case where the matching code CODE generated according to the impedance matching operation is not changed for a predetermined time. Impedance matching may be repeatedly performed with a constant cycle after being started in response to the driving signal DRV. This is because the fact that the matching code CODE retains a constant value means that the stably completed matching code CODE is obtained.

According to an embodiment, the completion signal generation unit 134 may operate by being activated in response to the select signal SEL. More specifically, if the select signal SEL is enabled, the completion signal DONE may not be generated.

Figure 6:
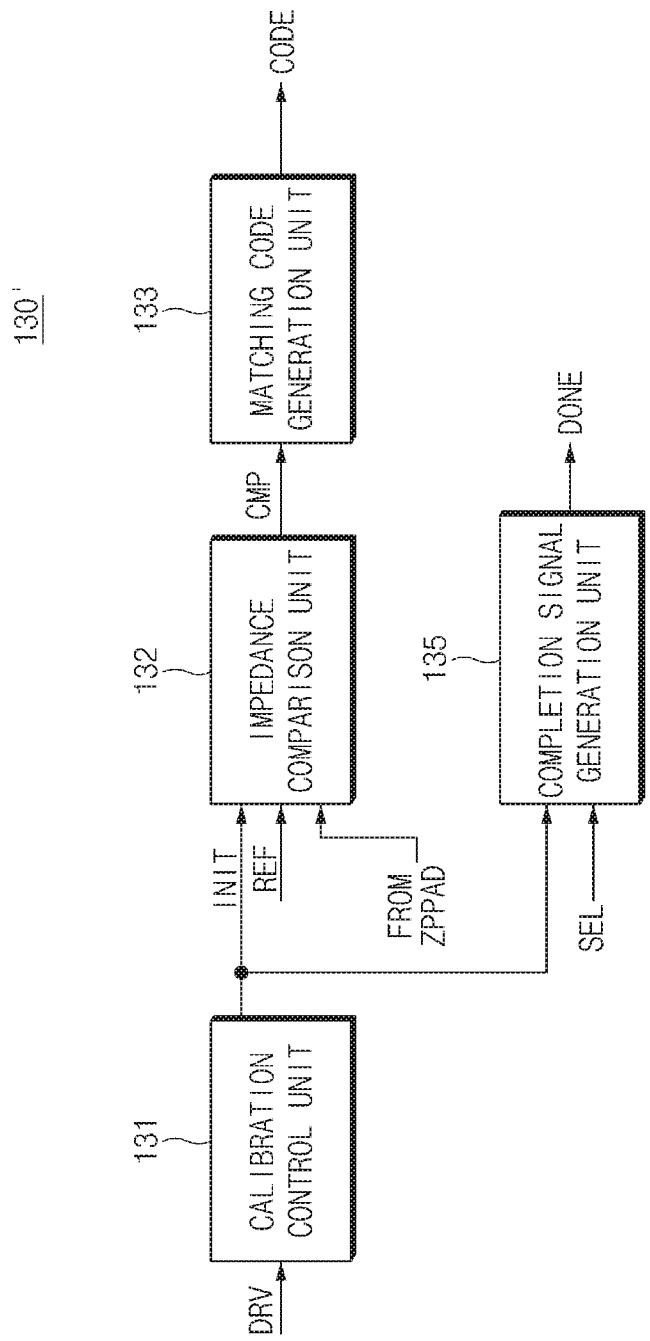
FIG. 6 is a block diagram illustrating a representation of an example of the calibration driver included in the calibration circuit in accordance with an embodiment.

Referring to FIG. 6, a block diagram illustrating a representation of an example of the calibration driver included in the calibration circuit in accordance with an embodiment is shown.

In FIG. 6, a calibration driver 130' may include a calibration control unit 131, an impedance comparison unit 132, a matching code generation unit 133, and a completion signal generation unit 135.

When comparing the calibration driver 130' of FIG. 6 with the calibration driver 130 of FIG. 5, the completion signal generation unit 135 counts a time from when an impedance matching operation is started to be performed by receiving an operation start signal INIT from the calibration control unit 131.

The completion signal generation unit 135 may generate the completion signal DONE when a preset time has passed after the impedance matching operation is started to be performed. For instance, the completion signal generation unit 135 may include a counter which operates in synchronization with an oscillation signal.

For example, in a calibration apparatus in which a plurality of calibration circuits are included, if impedance matching should be completed within a preselected time for all calibration circuits after the command signal CMD is applied, the preset time for the completion signal generation unit 135 to generate the completion signal DONE may be determined based on the number of the plurality of calibration circuits for which impedance matching should be sequentially performed.

As is apparent from the above descriptions, the calibration circuit 100 in accordance with an embodiment performs impedance matching, or, a calibrating operation in response to one of the external command signal CMD and the completion signal DONE generated according to impedance matching completion of another calibration circuit. Accordingly, where impedance matching is sequentially performed in a plurality of calibration circuits 100 which share the resistor R for impedance matching, since times required between operations of the respective calibration circuits 100 may be shortened, a total time required to perform calibration may be reduced as a result.

Further, in the calibration apparatus including the calibration circuit 100 in accordance with an embodiment, the calibration circuit 100 may perform a calibrating operation, or, impedance matching, in response to a signal indicating in which order among a plurality of entire calibration circuits impedance matching is to be performed.

Figure 7:
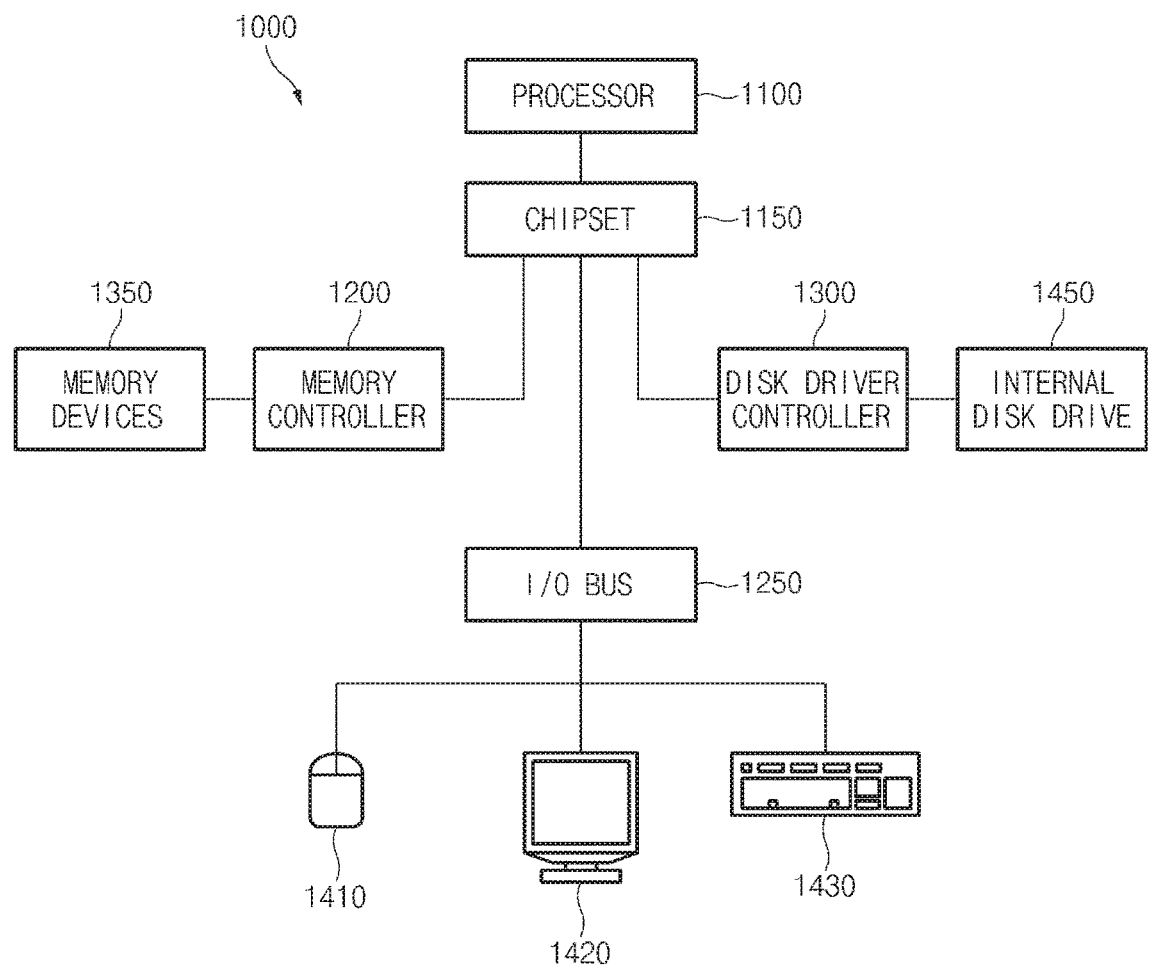
FIG. 7 illustrates a block diagram of a system employing a memory controller circuit in accordance with an embodiment of the invention.

Referring to FIG. 7, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory devices 1350 may include the calibration apparatus described above.

The chipset 1150 may also be electrically coupled to the I/O bus 1250. The I/O bus 1250 may serve as a communication pathway for signals from the chipset to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

While various embodiments have been described above, it will be understood to those skilled in the art that the embodiments described are by way of example only.

Accordingly, the calibration circuit and the calibration apparatus including the same described should not be limited based on the described embodiments above.

What is claimed is:

1. A system comprising:
a first semiconductor device;
a second semiconductor device;
a third semiconductor device; and
a fourth semiconductor device,
wherein the first semiconductor device to the fourth semiconductor device configured to share a resistor for impedance matching,
wherein first semiconductor device to the fourth semiconductor device are coupled to have a chain shape,
wherein the fourth semiconductor device generates a completion signal when performance is completed and the first semiconductor device receive the completion signal provided from the fourth semiconductor device.

2. The semiconductor device according to claim 1, wherein at least one of the first semiconductor device to the fourth semiconductor device includes a volatile memory and at least one of the first semiconductor device to the fourth semiconductor device includes a non-volatile memory.

3. The semiconductor device according to claim 1, wherein each semiconductor device comprises:
a first calibration driver configured to, based on a first calibration enable signal, perform an impedance matching operation according to the resistor, and
a signal generator configured to generate a completion signal when performance is completed.

4. The system according to claim 3, wherein each semiconductor device further comprises:
a command decoder configured to receive the command signal and decode the command signal into a second calibration enable signal; and
a selector configured to select the first completion signal between the first completion signal and the second calibration enable signal according to a select signal, and provide a driving signal,
wherein the second calibration driver is configured to perform the impedance matching operation according to the driving signal.

5. The system according to claim 1, wherein the semiconductor devices sequentially perform the impedance matching operation according to the chain shape.

6. A system comprising:
a first semiconductor device to an eighth semiconductor device,
wherein the first semiconductor device to the eighth semiconductor device configured to share a resistor for impedance matching,
wherein first semiconductor device to the eighth semiconductor device are coupled to have a chain shape,
wherein the eighth semiconductor device generate a completion signal when performance is completed and the first semiconductor device receive the completion signal provided from the eighth semiconductor device.

7. The system according to claim 6, wherein each semiconductor device comprises:
a calibration driver configured to perform an impedance matching operation using the resistor for the impedance matching, and
a signal generator configured to generate a completion signal when the performance is completed.

8. The system according to claim 6, wherein the semiconductor devices sequentially perform the impedance matching operation according to the chain shape.

9. The system according to claim 6, wherein at least one of the semiconductor devices includes a volatile memory and at least one of other semiconductor devices includes non-volatile memories.

10. A system comprising:
a first semiconductor device to an sixteenth semiconductor device,
wherein the first semiconductor device to the sixteenth semiconductor device configured to share a resistor for impedance matching,
wherein first semiconductor device to the sixteenth semiconductor device are coupled to have a chain shape,
wherein the sixteenth semiconductor device generate a completion signal when performance is completed and the first semiconductor device receive the completion signal provided from the sixteenth semiconductor device.

11. The system according to claim 10, wherein each semiconductor device are configured to sequentially perform the impedance matching operation.

12. The system according to claim 10, wherein each semiconductor device includes a calibration driver configured to perform an impedance matching operation by using the resistor and a signal generator configured to generate a status signal when the performance is completed.

13. The system according to claim 10, wherein the semiconductor devices sequentially perform the impedance matching operation according to the chain shape.

14. The system according to claim 10, wherein at least one of the semiconductor devices includes a volatile memory and at least one of other semiconductor devices includes non-volatile memories.

15. A system comprising:
a first semiconductor device to a thirty-second semiconductor device,
wherein the first semiconductor device to the thirty-second semiconductor device is configured to share a resistor for impedance matching,
wherein first semiconductor device to the thirty-second semiconductor device are coupled to have a chain shape,
wherein the thirty-second semiconductor device generate a completion signal when performance is completed and the first semiconductor device receive the completion signal provided from the thirty-second semiconductor device.

16. The system according to claim 15, wherein at least one of the semiconductor devices includes a volatile memory and at least one of other semiconductor devices includes non-volatile memories.

17. A system comprising:
a first semiconductor device;
a second semiconductor device;
a third semiconductor device; and
a fourth semiconductor device,
wherein the first semiconductor device to the fourth semiconductor device configured to share a resistor for impedance matching,
wherein first semiconductor device to the fourth semiconductor device are coupled to have a chain shape,
wherein at least one of the first semiconductor device to the fourth semiconductor device includes a volatile memory and at least one of the first semiconductor device to the fourth semiconductor device includes a non-volatile memory.

18. The semiconductor device according to claim 17, wherein each semiconductor device comprises:

a first calibration driver configured to, based on a first calibration enable signal, perform an impedance matching operation according to the resistor, and a signal generator configured to generate a completion signal when performance is completed.

19. The system according to claim 18, wherein each semiconductor device further comprises:

a command decoder configured to receive the command signal and decode the command signal into a second calibration enable signal; and a selector configured to select the first completion signal between the first completion signal and the second calibration enable signal according to a select signal, and provide a driving signal, wherein the second calibration driver is configured to perform the impedance matching operation according to the driving signal.

20. The system according to claim 17, wherein the semiconductor devices sequentially perform the impedance matching operation according to the chain shape.

* * * * *

UNITED STATES PATENT AND TRADEMARK OFFICE
CERTIFICATE OF CORRECTION

PATENT NO. : 10,491,215 B2
APPLICATION NO. : 16/101998
DATED : November 26, 2019
INVENTOR(S) : Oung Sic Cho and Jong Hoon Oh Page 1 of 3

It is certified that error appears in the above-identified patent and that said Letters Patent is hereby corrected as shown below:

In the Claims

Under "What is claimed is":

Claim 1, Column 11, Lines 11, 13 and 17 should read:
1. A system comprising:
a first semiconductor device;
a second semiconductor device;
a third semiconductor device; and
a fourth semiconductor device,
wherein the first semiconductor device to the fourth semiconductor device are configured to share a resistor for impedance matching,
wherein the first semiconductor device to the fourth semiconductor device are coupled to have a chain shape,
wherein the forth semiconductor device generates a completion signal when performance is completed and the first semiconductor device receives the completion signal provided from the fourth semiconductor device.

Claim 6, Column 11, Lines 50, 54 and 56 should read:
6. A system comprising:
a first semiconductor device to an eighth semiconductor device,
wherein the first semiconductor device to the eighth semiconductor device are configured to share a resistor for impedance matching,
wherein first semiconductor device to the eighth semiconductor device are coupled to have a chain shape,
wherein the eighth semiconductor device generates a completion signal when performance is completed and the first semiconductor device receives the completion signal provided from the eighth semiconductor device.

Signed and Sealed this
Fourteenth Day of April, 2020

Andrei Iancu
*Director of the United States Patent and Trademark Office*

CERTIFICATE OF CORRECTION (continued)  
U.S. Pat. No. 10,491,215 B2

Claim 9, Column 12, Line 4 should read:
9. The system according to claim 6, wherein at least one of the semiconductor devices includes a volatile memory and at least one of other semiconductor devices includes non-volatile memory.

Claim 10, Column 12, Lines 9, 11, 13 and 15 should read:
10. A system comprising:
a first semiconductor device to an sixteenth semiconductor device,
wherein the first semiconductor device to the sixteenth semiconductor device are configured to share a resistor for impedance matching,
wherein the first semiconductor device to the sixteenth semiconductor device are coupled to have a chain shape,
wherein the sixteenth semiconductor device generates a completion signal when performance is completed and the first semiconductor device receives the completion signal provided from the sixteenth semiconductor device.

Claim 14, Column 12, Line 32 should read:
14. The system according to claim 10, wherein at least one of the semiconductor devices includes a volatile memory and at least one of other semiconductor devices includes non-volatile memory.

Claim 15, Column 12, Lines 37, 39, 42 and 44 should read:
15. A system comprising:
a first semiconductor device to a thirty-second semiconductor device,
wherein the first semiconductor device to the thirty-second semiconductor device are configured to share a resistor for impedance matching,
wherein the first semiconductor device to the thirty-second semiconductor device are coupled to have a chain shape,
wherein the thirty-second semiconductor device generates a completion signal when performance is completed and the first semiconductor device receives the completion signal provided from the thirty-second semiconductor device.

Claim 16, Column 12, Line 50 should read:
16. The system according to claim 15, wherein at least one of the semiconductor devices includes a volatile memory and at least one of other semiconductor devices includes non-volatile memory.

Claim 17, Column 12, Lines 57 and 59 should read:
17. A system comprising:
a first semiconductor device;
a second semiconductor device;
a third semiconductor device; and
a fourth semiconductor device,
wherein the first semiconductor device to the fourth semiconductor device are configured to share a resistor for impedance matching,
wherein the first semiconductor device to the fourth semiconductor device are coupled to have a chain shape,
wherein at least one of the first semiconductor device to the fourth semiconductor device includes a volatile memory and at least one of the first semiconductor device to the fourth semiconductor device includes a non-volatile memory.